United States Patent
Kusko et al.

(10) Patent No.: US 10,247,776 B2
(45) Date of Patent: Apr. 2, 2019

(54) STRUCTURALLY ASSISTED FUNCTIONAL TEST AND DIAGNOSTICS FOR INTEGRATED CIRCUITS

(71) Applicant: International Business Machines Corporation, Armonk, NY (US)

(72) Inventors: Mary P. Kusko, Hopewell Junction, NY (US); Franco Motika, Hopewell Junction, NY (US); Gerard M. Salem, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 15/439,161

(22) Filed: Feb. 22, 2017

(65) Prior Publication Data
US 2018/0238962 A1 Aug. 23, 2018

(51) Int. Cl.
*G01R 31/317* (2006.01)
*G01R 31/3177* (2006.01)
*G01R 31/327* (2006.01)

(52) U.S. Cl.
CPC ... *G01R 31/31703* (2013.01); *G01R 31/3177* (2013.01); *G01R 31/31707* (2013.01)

(58) Field of Classification Search
CPC ........ G01R 31/31703; G01R 31/31707; G01R 31/3177; G01R 31/318555; G01R 31/318533
See application file for complete search history.

(56) References Cited

U.S. PATENT DOCUMENTS

| | | | |
|---|---|---|---|
| 5,694,402 A * | 12/1997 | Butler | G06F 11/277 714/30 |
| 6,018,815 A | 1/2000 | Baeg | |
| 6,463,560 B1 | 10/2002 | Bhawmik et al. | |
| 6,484,280 B1 | 11/2002 | Moberly | |
| 6,516,432 B1 * | 2/2003 | Motika | G01R 31/318577 714/726 |
| 6,836,866 B2 | 12/2004 | Nolles et al. | |
| 7,191,373 B2 | 3/2007 | Wang et al. | |
| 7,574,644 B2 | 8/2009 | Forlenza et al. | |

(Continued)

OTHER PUBLICATIONS

List of IBM Patents or Patent Applications Treated as Related, Apr. 7, 2017, 2 pages.

(Continued)

*Primary Examiner* — April Y Blair
*Assistant Examiner* — Dipakkumar B Gandhi
(74) *Attorney, Agent, or Firm* — Cantor Colburn LLP; Margaret McNamara (57) ABSTRACT

Structurally assisted functional test and diagnostics include executing one or more functional test exercisers in a functional execution sequence for a device under test up to one or more checkpoints. One or more built-in structural test support circuits of the device under test is applied to identify one or more likely causes of a failure identified at the one or more checkpoints. A portion of the functional execution sequence between a plurality of the checkpoints is iteratively invoked to progressively isolate the one or more likely causes of the failure as a most likely failure source in combination with one or more results from the one or more built-in structural test support circuits.

14 Claims, 9 Drawing Sheets

(56) References Cited

U.S. PATENT DOCUMENTS

| | | | |
|---|---|---|---|
| 9,297,855 B1* | 3/2016 | Jindal | G01R 31/3177 |
| 9,448,282 B1* | 9/2016 | Meehl | G01R 31/318335 |
| 2002/0046377 A1* | 4/2002 | Kniffler | G01R 31/318547 714/739 |
| 2004/0004482 A1 | 1/2004 | Bouabdo et al. | |
| 2005/0097418 A1* | 5/2005 | Anzou | G01R 31/318555 714/733 |
| 2008/0320347 A1* | 12/2008 | Cussonneau | G01R 31/31703 714/723 |
| 2012/0159273 A1* | 6/2012 | Douskey | G01R 31/318558 714/731 |

OTHER PUBLICATIONS

P. Parvathala, et al., FRITS—A Microprocessor Functional BIST Method, ITC International Test Conference, 2002 IEEE, 9 pages.

P. Song, et al., S/390 G5 CMOS microprocessory diagnostics, IBM J. Res. Develop., vol. 43 No. 5/6 Sep./Nov. 1999, 16 Pages.

U.S. Appl. No. 15/439,176, filed Feb. 22, 2017, Entitled: Non-Destructive Recirculation Test Support for Integrated Circuits, First Named Inventor: Mary P. Kusko.

List of IBM Patents or Patent Applications Treated as Related, Oct. 3, 2017, 2 pages.

U.S. Appl. No. 15/718,271, filed Sep. 28, 2017, Entitled: Functional Diagnostics Based on Dynamic Selection of Alternate Clocking, First Named Inventor: Mary P. Kusko.

Kusko et al., "Functional Diagnostics Based on Dynamic Selection of Alternate Clocking"; U.S. Appl. No. 15/805,586, filed Nov. 7, 2017.

List of IBM Patents or Patent Applications Treated as Related, Jan. 12, 2018, 2 pages.

* cited by examiner

STRUCTURALLY ASSISTED FUNCTIONAL TEST AND DIAGNOSTICS FOR INTEGRATED CIRCUITS

BACKGROUND

Aspects are related generally to integrated circuit testing, and more specifically to structurally assisted functional test and diagnostics for integrated circuits.

When developing integrated circuit systems, resulting devices need to be tested and faults diagnosed. A common diagnostic approach in industry uses post-test software algorithms that run on fail data collected at a test system. To generate the data, patterns can be applied to a device under test and the responses collected. Failing responses can be fed into design automation software which analyzes the fail data and gives suspected callouts for the defect detected. A set of faults is associated with each design. A typical fault model is the "stuck-at" fault model, which includes both a stuck-at-1 and stuck-at-0 fault. The design is typically a gate-level representation (AND, OR, XOR, etc.), and the faults are applied at the inputs and outputs of each logic block. Based on a complete list of faults, diagnostic software typically produces a callout identifying the most likely faults to explain the faulty response. The goal is to have a precise enough callout so that physical failure analysis can be done on the device under test to identify the physical defect and determine the root cause.

Generally, there are two types of diagnostic techniques: cause-effect analysis techniques and effect-cause analysis techniques. Cause-effect techniques depend on stored symptoms caused by possible faults and use the observed responses to locate the fault. A fault dictionary approach is one such example. Problems with this approach, especially for large chips, can include excessively long simulation run time with prohibitively large memory requirements and ineffective physical and electrical failure analysis due to low diagnostic resolution. In contrast, effect-cause techniques do not depend on pre-stored data but instead process the response obtained from the device under test to determine the possible faults that generate the response. Effect-cause algorithms are less processing resource intensive and are well suited to fault diagnostics. Software diagnostic techniques are typically faster than other methods; however, fault candidates can be wrong or there can be too many candidates with low scores. A fault with a low score is one with a low probability of explaining the failure. This can result from incomplete fail data, un-modeled fault types such as path delay and bridging faults, and faults in areas of logic that are not fully represented in the fault model (such as clock logic). All of these have resulted in a need for better, improved systems and methods.

SUMMARY

According to one embodiment, a method of structurally assisted functional test and diagnostics includes executing one or more functional test exercisers in a functional execution sequence for a device under test up to one or more checkpoints. One or more built-in structural test support circuits of the device under test is applied to identify one or more likely causes of a failure identified at the one or more checkpoints. A portion of the functional execution sequence between a plurality of the checkpoints is iteratively invoked to progressively isolate the one or more likely causes of the failure as a most likely failure source in combination with one or more results from the one or more built-in structural test support circuits.

According to a further embodiment, a system includes a device under test and a test and diagnostic system. The device under test includes one or more functional test exercisers and one or more built-in structural test support circuits. The test and diagnostic system includes a processor operable to initiate execution of a functional execution sequence in the one or more functional test exercisers up to one or more checkpoints and configure the device under test to apply the one or more built-in structural test support circuits to identify one or more likely causes of a failure identified at the one or more checkpoints, and iteratively invoke a portion of the functional execution sequence between a plurality of the checkpoints to progressively isolate the one or more likely causes of the failure as a most likely failure source in combination with one or more results from the one or more built-in structural test support circuits.

According to another embodiment, a computer program product includes a computer readable storage medium having program instructions embodied therewith, where the computer readable storage medium is not a transitory signal per se. The program instructions are executable by a processor to cause the processor to perform a method that includes executing one or more functional test exercisers in a functional execution sequence for a device under test up to one or more checkpoints and applying one or more built-in structural test support circuits of the device under test to identify one or more likely causes of a failure identified at the one or more checkpoints. The program instructions executable by the processor further cause the processor to iteratively invoke a portion of the functional execution sequence between a plurality of the checkpoints to progressively isolate the one or more likely causes of the failure as a most likely failure source in combination with one or more results from the one or more built-in structural test support circuits.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

Embodiments are directed to structurally-assisted functional test and diagnostics for a device or system under test. Structural testing typically verifies that proper connections are made between low-level logic blocks without concern for higher-level functional aspects that may be involved in actual execution of instruction sequences. Embodiments combine integrated structural design and diagnostic methods with functional test exercisers. Embodiments can use structural design for test (DFT) and logic built-in self-test (LBIST) of on-chip test support systems with diagnostics such as selective signature generation. The testing and diagnostics can be performed at the chip level and expanded to support higher level package and system test.

Embodiments include functional test diagnostics used in conjunction with a structural test methodology to facilitate testing of large integrated functional designs. Functional exercisers or tests can be performed up to one or more checkpoints (also referred to as breakpoints) and then structural DFT and built-in diagnostic support can be used to isolate the cause of a failure. The diagnostic process can be iteratively invoked for multiple checkpoints by restarting and continuing the functional execution sequence to the next checkpoint.

Figure 1:
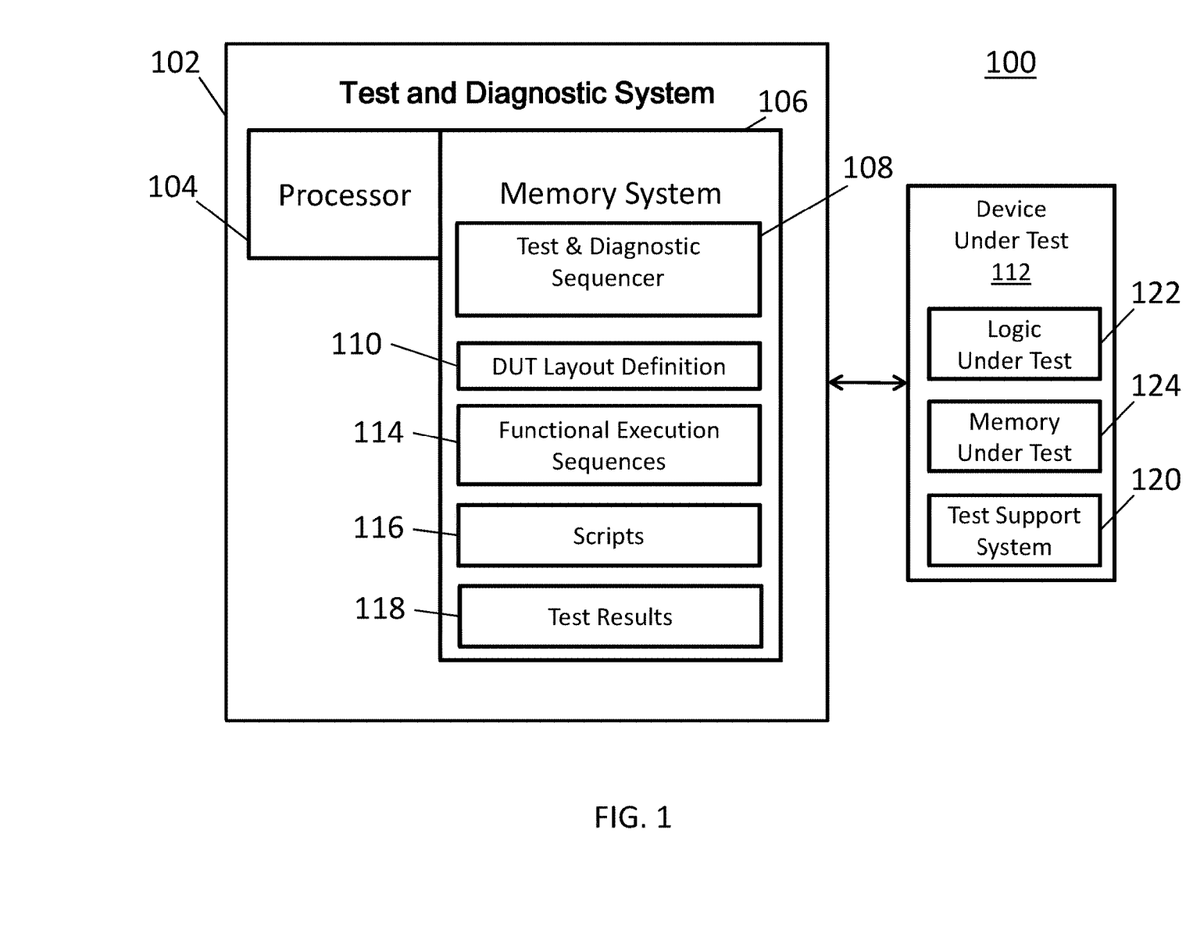
FIG. 1 illustrates a system in accordance with an embodiment.

Turning now to FIG. 1, a system 100 is generally shown that includes a test and diagnostic system 102 that may be used as part of an integrated circuit (IC) development system configured to incorporate an integrated circuit layout into a device under test (DUT) 112 and verify/troubleshoot operation of the DUT 112. For example, the DUT 112 may be fabricated as an IC chip, and the test and diagnostic system identifies failures in the DUT 112 and identifies one or more likely causes of failures in the DUT 112. The DUT 112 can be distributed by the fabricator in raw wafer form (that is, as a single wafer that has multiple unpackaged chips), as a bare die, or in a packaged form. In the latter case the DUT 112 can be mounted in a single chip package (such as a plastic carrier, with leads that are affixed to a motherboard or other higher level carrier) or in a multichip package (such as a ceramic carrier that has either or both surface interconnections or buried interconnections). The DUT 112 may also be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Continuing with the description of FIG. 1, the test and diagnostic system 102 includes a processor 104 and a memory system 106. The processor 104 can be any type of processing circuitry and/or microcontroller, including multiple instances thereof, that is configurable to execute processes further described herein, where the memory system 106 is an example of a tangible storage medium. The memory system 106 can include a test and diagnostic sequencer 108, a DUT layout definition 110, one or more functional execution sequences 114, scripts 116, and test results 118. In an exemplary embodiment, the processor 104 is coupled to the memory system 106, and the processor 104 is configured to execute the test and diagnostic sequencer 108 to execute one or more portions of the functional execution sequences 114 on a test support system 120 of the DUT 112 to verify operation and diagnose a cause of one or more failure of logic under test 122 and/or memory under test 124 of the DUT 112. In some embodiments, the scripts 116 can be used to select portions of the functional execution sequences 114 to run and to support a searching process to isolate the cause of a failure in combination with the DUT layout definition 110. Failure information can be captured in the test results 118 to indicate a likely failure cause in the DUT 112 as referenced against the DUT layout definition 110.

The logic under test 122 in the DUT 112 can include various logic circuits with latches and logic blocks (e.g., logic gates) organized to implement a particular function, such as an arithmetic logic unit, a decoding unit, an instruction fetch unit, and other such functional blocks that may be present in a processor or other type of integrated circuit. The memory under test 124 can be within the DUT 112 and/or otherwise accessible by the DUT 112, such as internal memory, cache memory, main memory, and the like. The test support system 120 in the DUT 112 can include one or more self-test chains for LBIST and one or more signature registers to capture and verify the functional state of the DUT 112. For example, the functional execution sequences 114 can include a sequence of instructions that invoke a sequence of operations on either or both of the logic under test 122 and/or the memory under test 124. Failures may not be readily identified immediately upon occurrence but may be identified after a sequence of multiple operations are performed as values flow through self-test chains and results are captured in one or more signature registers of the test support system 120. Embodiments use a sequence of checkpoints and selectively re-execute different sized portions of the functional execution sequences 114 in combination with applying one or more built-in structural test support circuits of the DUT 112 to identify one or more likely causes of a failure identified at one or more checkpoints as further described herein.

Figure 2:
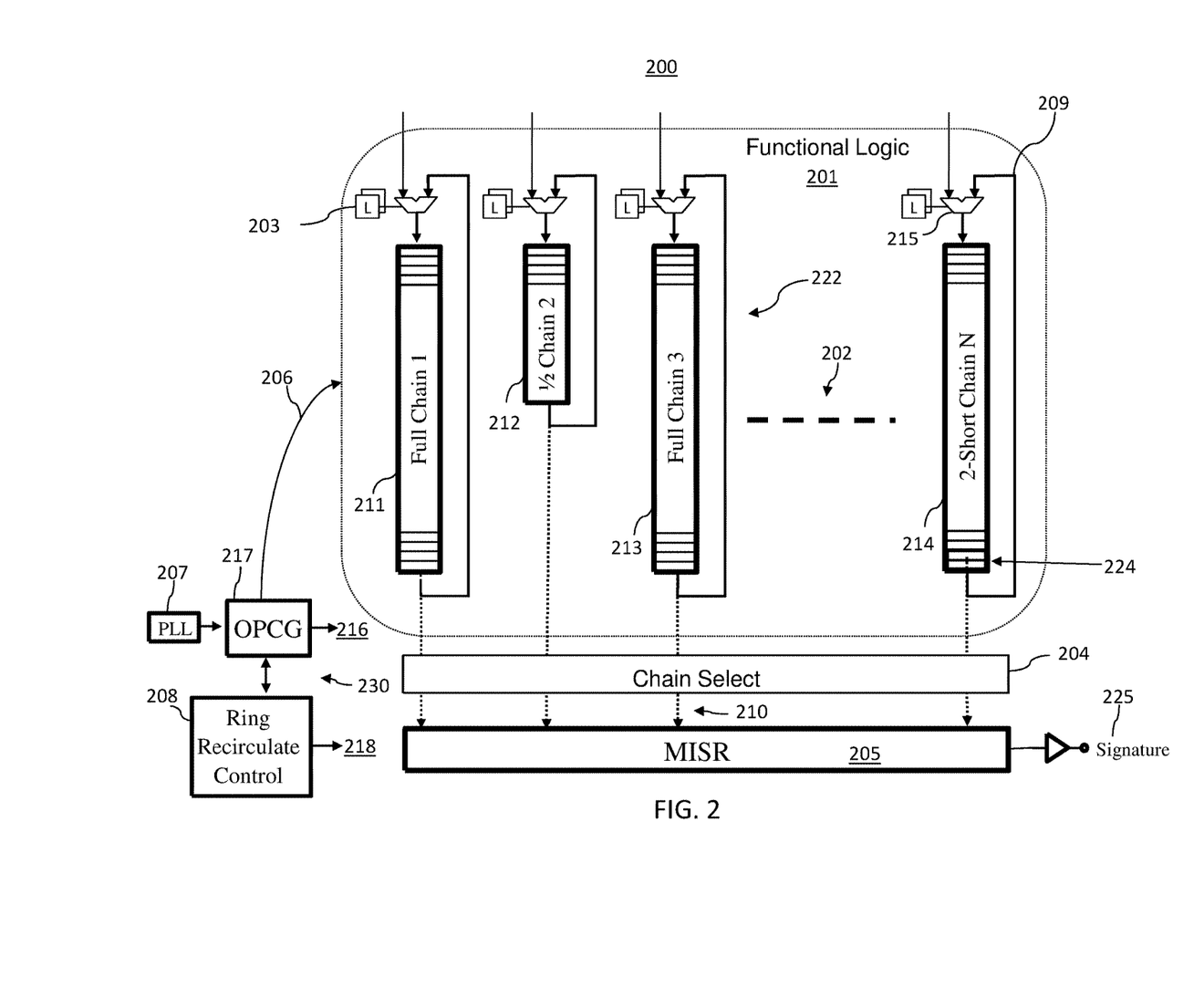
FIG. 2 illustrates an example of a test support system in a device under test in accordance with an embodiment.

FIG. 2 illustrates an example of a test support system 200 as an embodiment of the test support system 120 of FIG. 1. The test support system 200 includes functional logic 201 that controls the flow of test data through a plurality of built-in structural test support circuits 202 including self-test chains 222. The self-test chains 222 can include a plurality of individual self-test using MISR and parallel shift register sequence generators (STUMP) channels, where a MISR is a multiple input signature register, such as MISR 205. In the example of FIG. 2, the self-test chains 222 are depicted as a half chain 212 (half of maximum length chain), two full chains 211, 213 (maximum length chains), and a 2-short chain 214 (maximum length chain minus two, which may include latch padding 224 to balance recirculating scan chain length, for instance). The self-test chains 222 can be formed from storage elements, such as latches or registers, of the logic under test 122 of FIG. 1.

When in LBIST mode of operation, the storage elements can be concatenated in one or more self-test chains 222, which may be externally and individually accessible via one or more serial inputs and outputs. The self-test chains 222 can be loaded and unloaded serially for each LBIST test. Once in LBIST mode, one or more scan chains of storage elements can be reconfigured into a number of parallel sub-chains as the self-test chains 222 including chains 211, 212, 213, 214. During structural testing, pseudo-random data can be loaded in parallel into each of the self-test chains 222 as supplied by a linear feedback shift register (LFSR) (not depicted), for example, and used as test stimuli. During functional testing, inputs to the self-test chains 222 are based on instruction sequencing and/or memory operations with respect to the logic under test 122 and/or the memory under test 124 when performing functional execution sequences 114 of FIG. 1. Similarly, the state of all latches in the self-test chains 222 can be unloaded serially through chain select 204 as STUMP channel scan output 210 into the MISR 205 forming a signature 225 representing compressed data results.

Each LBIST test cycle, in addition to the loading and unloading of the self-test chains 222, uses timed application of system clocks to launch a test vector through self-test chains 222 and capture a resulting response in receiving latches. A typical system design may include several system clocks and various path delays; therefore, a clock test sequence and timing setup may be applied multiple times with different clock combinations and timings. Test timing can be controlled by phase locked loop 207 and an on-product clock generation (OPCG) function 217 to produce scan clocks 206 for structural and functional exercising of the functional logic 201 and MISR controls and clocks 216 for MISR 205.

An LBIST test interval can include a relatively large number of load/unload sequences followed by the system clock cycle. At the end of the interval, the MISR 205 contents or signature 225 can be unloaded and compared to an expected signature. Several signature intervals may be applied to achieve the desired test coverage.

The example of FIG. 2 also depicts a multiple ring configuration with recirculating feedback in the functional logic 201 through one or more recirculating feedbacks 209. Recirculation capability can be provided for each of the self-test chains 222. One or more recirculating mode enable latches 203 can be used to determine whether each of the self-test chains 222 is operating as a scan chain or in a recirculating mode through selectors 215. A ring recirculate control 208 can interface with the OPCG 217 for recirculating scan control channel selection 218 and to provide controls for the MISR 205 in recirculating operation. The OPCG 217 and/or the ring recirculate control 208 are examples of one or more functional test exercisers 230 that can support execution of the functional execution sequences 114 of FIG. 1. After a ring dump to the MISR 205, a functional test can be restarted to progressively isolate a failure source. Recirculation can support the ability to restart the functional execution sequences 114 of FIG. 1 at a checkpoint position rather than restarting at the beginning of an execution sequence to speed the process of progressively isolating one or more likely causes of a failure as a most likely failure source. Although one or more recirculating feedbacks 209 are depicted in the example of FIG. 2, in other embodiments the one or more recirculating feedbacks 209 can be omitted.

Figure 3:
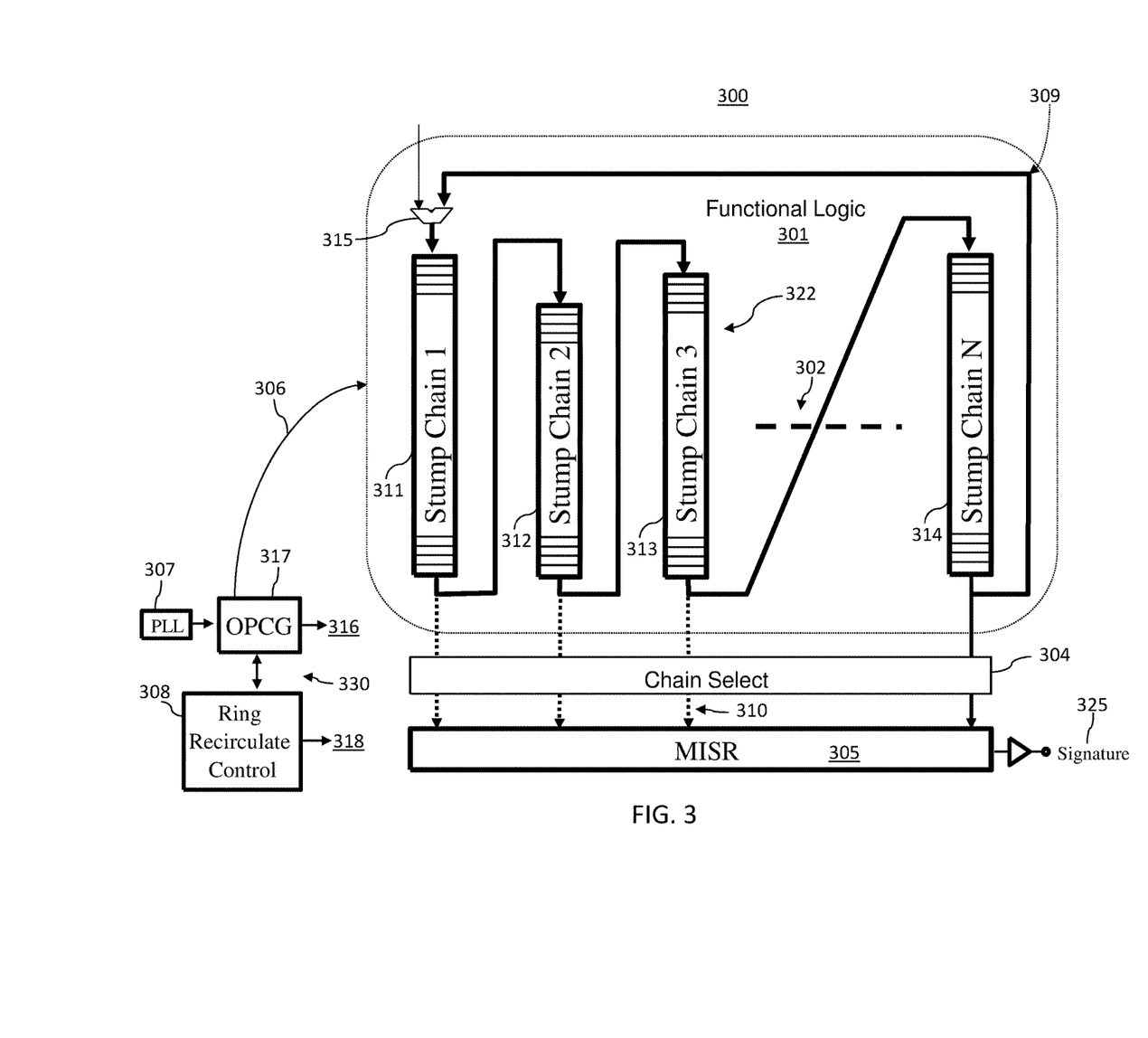
FIG. 3 illustrates another example of a test support system in a device under test in accordance with an embodiment.

FIG. 3 illustrates another example of a test support system 300 in a device under test in accordance with an embodiment, such as the test support system 120 of DUT 112 of FIG. 1. The test support system 300 includes functional logic 301 that controls the flow of test data through a plurality of built-in structural test support circuits 302 including self-test chains 322. The self-test chains 322 can include a plurality of STUMP chains 311, 312, 313, 314 of various lengths. The self-test chains 322 can be formed from storage elements, such as latches or registers, of the logic under test 122 of FIG. 1. When in LBIST mode of operation, the storage elements can be concatenated in one or more self-test chains 322, which may be externally accessible via one or more serial inputs and outputs. One or more of the self-test chains 322 can be loaded and unloaded serially for each LBIST test. Once in LBIST mode, one or more scan chains of storage elements can be reconfigured into a number of parallel sub-chains as the self-test chains 322 including chains 311, 312, 313, 314.

During functional testing, inputs to the self-test chains 322 are based on instruction sequencing and/or memory operations with respect to the logic under test 122 and/or the memory under test 124 when performing functional execution sequences 114 of FIG. 1. Similarly, the state of all latches in the self-test chains 322 can be unloaded serially through chain select 304 as STUMP channel scan output 310 into the MISR 305 forming a signature 325 representing compressed data results.

Each LBIST test cycle, in addition to the loading and unloading of the self-test chains 322, uses timed application of system clocks to launch a test vector through self-test chains 322 and capture a resulting response in receiving latches. Test timing can be controlled by phase locked loop 307 and an OPCG function 317 to produce scan clocks 306 for structural and functional exercising of the functional logic 301 and MISR clocks 316.

In the example of FIG. 3, all self-test chains 322 in the LBIST structure can be chained to provide a single recirculation feedback 309 from the last STUMP chain 314 scan-out point back to STUMP chain 311 through selector 315. Concatenated chain lengths in the self-test chains 322 may be balanced to restore a pre-scan initial state of the latches in the self-test chains 322. A ring recirculate control 308 can interface with the OPCG 317 for recirculating scan control channel selection 318 and to provide controls for the MISR 305 in recirculating operation. The OPCG 317 and/or the ring recirculate control 308 are examples of one or more functional test exercisers 330 that can support execution of the functional execution sequences 114 of FIG. 1. After a ring dump to the MISR 305, a functional test can be restarted to progressively isolate a failure source. Recirculation can support the ability to restart the functional execution sequences 114 of FIG. 1 at a checkpoint position rather than restarting at the beginning of an execution sequence to speed the process of progressively isolating one or more likely causes of a failure as a most likely failure source. Although one recirculating feedback 309 is depicted in the example of FIG. 3, in other embodiments the recirculating feedback 309 can be omitted.

Figure 4:
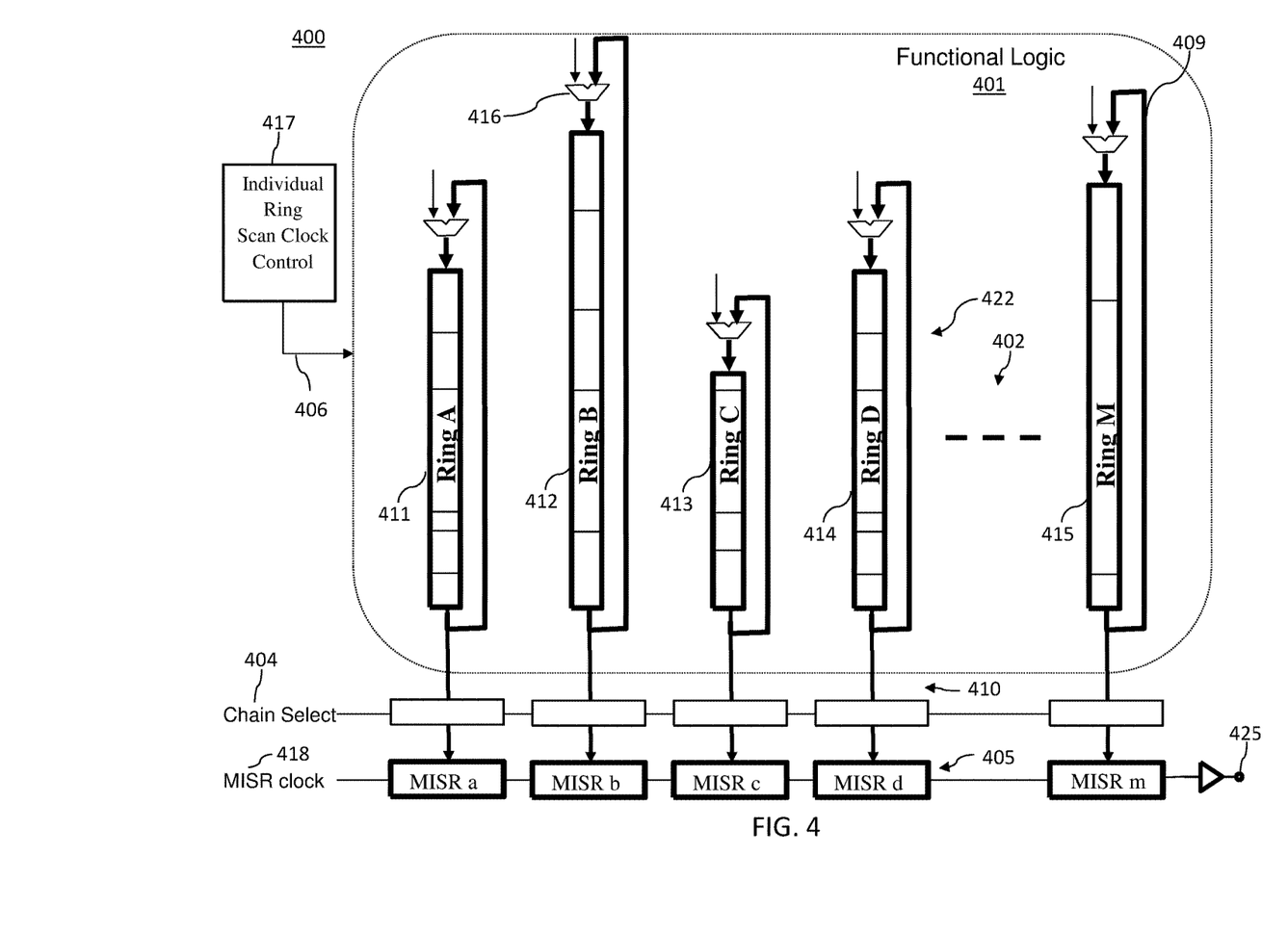
FIG. 4 illustrates a further example of a test support system in a device under test in accordance with an embodiment.

FIG. 4 illustrates a further example of a test support system 400 in a device under test in accordance with an embodiment, such as the test support system 120 of DUT 112 of FIG. 1. The test support system 400 includes functional logic 401 that controls the flow of test data through a plurality of built-in structural test support circuits 402 including self-test chains 422. The self-test chains 422 can include a plurality of STUMP rings 411, 412, 413, 414, 415 of various lengths. The self-test chains 422 can be formed from storage elements, such as latches or registers, of the logic under test 122 of FIG. 1. When in LBIST mode of operation, the storage elements can be concatenated in one or more self-test chains 422, which may be externally and individually accessible via one or more serial inputs and outputs. One or more of the self-test chains 422 can be loaded and unloaded serially for each LBIST test. Once in LBIST mode, one or more scan chains of storage elements can be reconfigured into a number of parallel sub-chains as the self-test chains 422 including rings 411, 412, 413, 414, 415.

During functional testing, inputs to the self-test chains 422 are based on instruction sequencing and/or memory operations with respect to the logic under test 122 and/or the memory under test 124 when performing functional execution sequences 114 of FIG. 1. Similarly, the state of all latches in the self-test chains 422 can be unloaded serially through individual chain selects 404 as STUMP channel scan outputs 410 into the MISRs 405 forming a signature 425 representing the compressed data.

Each LBIST test cycle, in addition to the loading and unloading of the self-test chains 422, uses timed application of system clocks to launch a test vector from through self-test chains 422 and capture a resulting response in receiving latches. Test timing can be controlled by individual ring scan clock control 417 to produce scan clocks 406 for functional exercising of the functional logic 401 and MISR clocks 418 for MISRs 405.

In the example of FIG. 4, all self-test chains 422 in the LBIST structure are independent rings formed using a recirculation feedback 409 for each of the self-test chains 422 to loop back to itself through a respective selector 416. After a ring dump to the MISRs 405, a functional test can be restarted to progressively isolate a failure source. Recirculation can support the ability to restart the functional execution sequences 114 of FIG. 1 at a checkpoint position rather than restarting at the beginning of an execution sequence to speed the process of progressively isolating one or more likely causes of a failure as a most likely failure source. Each of the self-test chains 422 can have an individual one of the MISRs 405 for generating signatures for individual rings.

With respect to the examples of FIGS. 1-4, the functional state of the DUT 112 can be verified based on STUMP chain configuration for LBIST. MISRs 205, 305, 405 can be used from LBIST STUMP channels to verify the functional state of the DUT 112. A functional run defined by the functional execution sequences 114 can be checkpointed by stopping the clocks and recirculating the rings (where recirculating feedback 209, 309, 409 is available/used). Chain/ring outputs can be selectively passed to one or more of the MISRs 205, 305, 405. In multiple instances of similar core design, core MISRs can be checked against each other internally, for example. Multiple checkpoint dumps can be accumulated in the MISRs 205, 305, 405. Functional clock start/stop/restart and dynamically modifiable checkpoints can be used to cycle through different functional execution sequence portions to iteratively invoke a portion of a functional execution sequence between a plurality of the checkpoints to progressively isolate the one or more likely causes of the failure as a most likely failure source in combination with one or more results from the one or more built-in structural test support circuits. The diagnostic process can be automated via a scripting sequence in the scripts 116 of FIG. 1.

Figure 5:
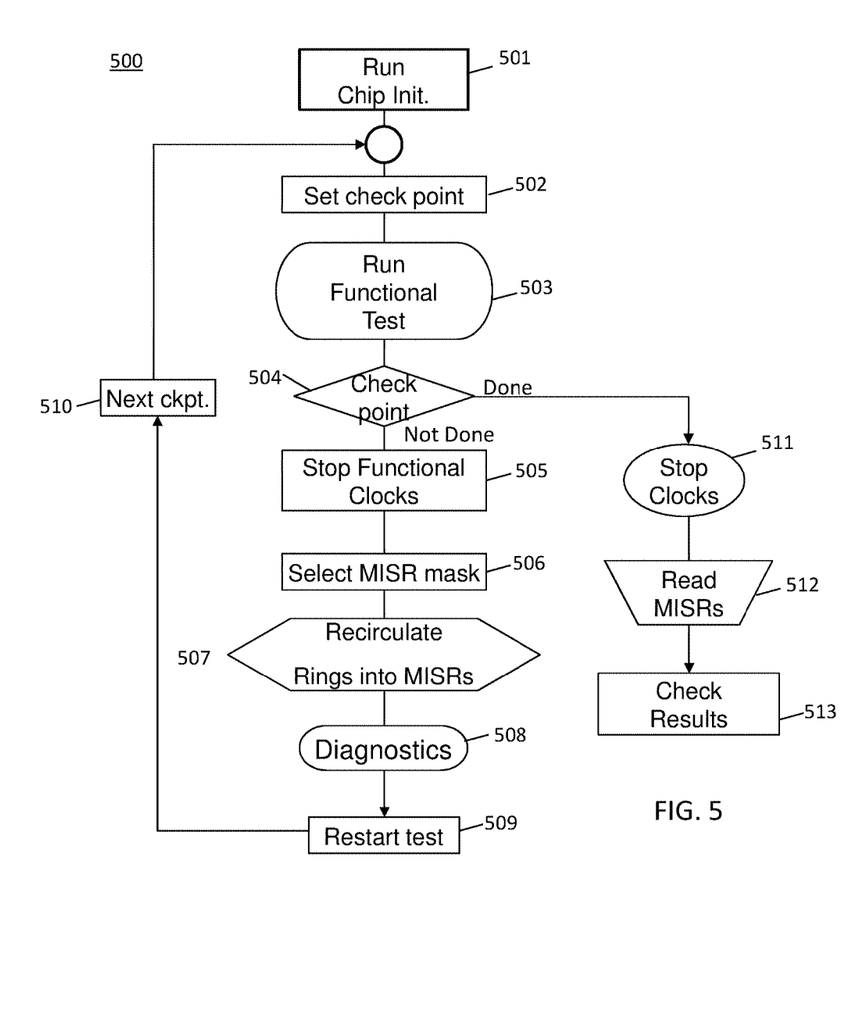
FIG. 5 illustrates an example of a function checkpoint signature generation process flow in accordance with an embodiment.

FIG. 5 illustrates an example of a function checkpoint signature generation process flow 500 in accordance with an embodiment. At block 501, a chip initialization sequence is run to setup the DUT 112 of FIG. 1 in a functional mode. At block 502, one or more checkpoints are set. Additional checkpoints can be added dynamically. Checkpoints can be added at a clock stop count or at particular steps in an architectural verification pattern flow. At block 503, a functional test exerciser run begins, for instance to execute an instruction sequence on the DUT 112 of FIG. 1 as defined by a portion of the functional execution sequences 114 covering one or more functional aspect of the logic under test 122 and/or memory under test 124 of FIG. 1.

Upon reaching a checkpoint at block 504, a check is performed to determine whether functional testing is done. At block 505, if functional testing is not done, functional clocks are stopped and a ring dump can be set to recirculate mode (where recirculation is used). At block 506, desired MISR masks can be set for MISRs 205, 305, 405. At block 507, rings can be recirculated in the MISRs 205, 305, 405 to generate intermediate signatures. At block 508, if dynamic diagnostics are enabled, a diagnostic sequence can be performed, such as the functional diagnostic process flow 600 of FIG. 6; otherwise, at block 509, testing is restarted or continued. At block 510, a next checkpoint is determined and set again at block 502.

If testing is done after the checkpoint of block 504, then exerciser testing is stopped and functional clocks are stopped at block 511. At block 512, the MISRs 205, 305, 405 are dumped or read. At block 513, results are checked to determine whether signature 225, 325, 425 indicates a pass signature or a fail signature. Any failing signatures can be further analyzed to progressively isolate one or more likely causes of the failure as a most likely failure source. Note that multiple interim signatures can be dumped for all checkpoints if required for off-line diagnostics.

Figure 6:
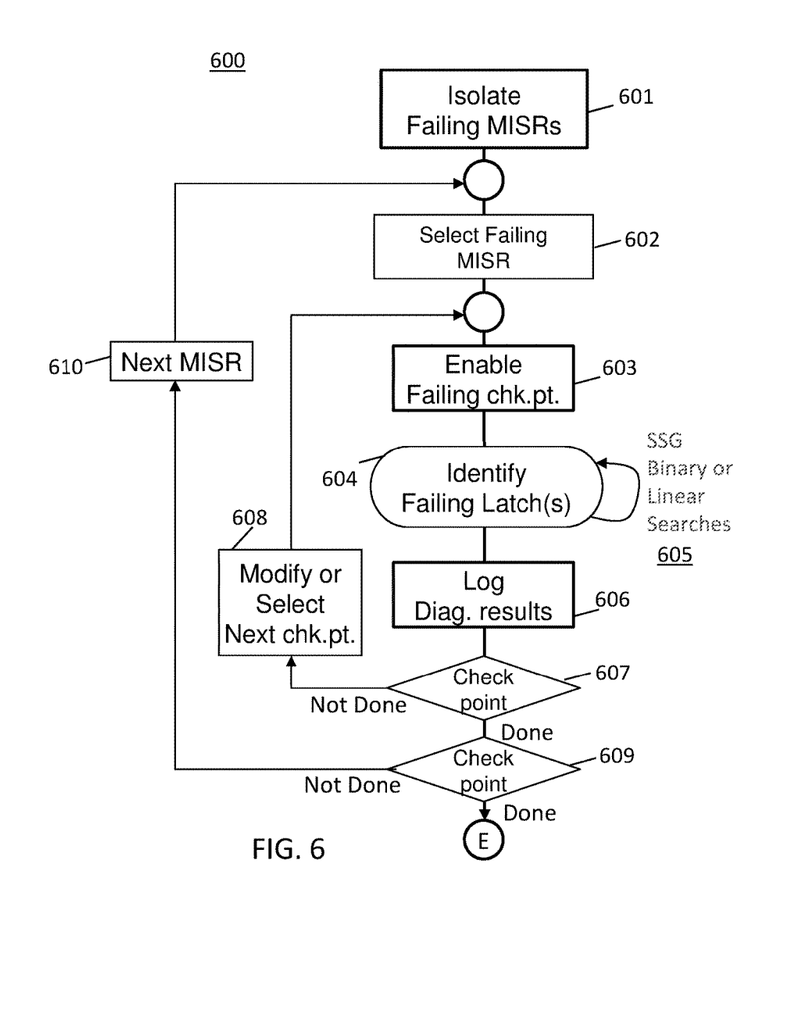
FIG. 6 illustrates a signature register based functional diagnostic process flow in accordance with an embodiment.

FIG. 6 illustrates a signature register based functional diagnostic process flow 600 in accordance with an embodiment. At block 601, failing MISRs 205, 305, 405 can be isolated via channel selection and comparison to known-good signatures. At block 602, a failing MISR can be selected from block 601. At block 603, a failing checkpoint can be enabled to repeat a failing condition. At block 604, failing latches can be identified using, for example, iterative selective signature generation (SSG) or linear/binary searching 605. SSG parameters can include checkpoint, channel masking, and aperture mode. At block 606, diagnostic results can be logged for analysis, for instance, in test results 118 of FIG. 1. At block 607, it is determined whether all checkpoints for the current failure under analysis have been exhausted. If not all checkpoints for the current failure under analysis have been checked, then at block 608, a next checkpoint is set and the flow returns to block 603. If all checkpoints for the current failure have been checked at block 607, then it is determined at block 609 whether other MISRs 205, 305, 405 had failure indications. If all failures have been diagnosed at block 609, then the flow exits; otherwise, the next MISR 205, 305, 405 is selected at block 610 and the process returns to block 602.

Figure 7:
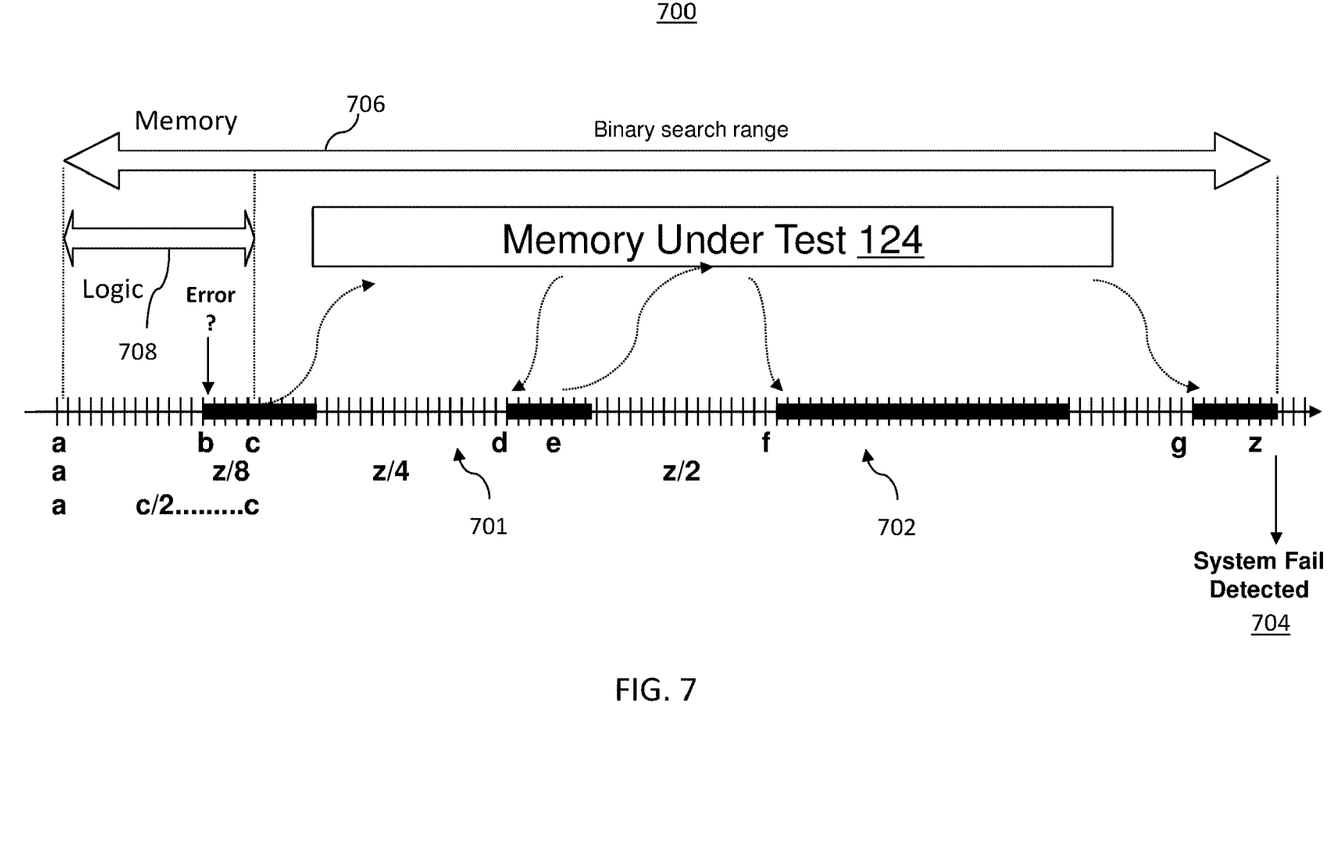
FIG. 7 illustrates an example of a functionally assisted diagnostic search sequence in accordance with an embodiment.

FIG. 7 illustrates an example of a functionally assisted diagnostic search sequence 700 in accordance with an embodiment and is described with reference to FIGS. 1-6. Embodiments can identify a variety of failure combinations and use various search algorithms to isolate a most likely failure source. For example, based on non-destructive unloads, recirculating self-test chains 222, 322, 422 to MISRs 205, 305, 405 can be used dump intermediate values and start/restart on any cycle and examine the signatures 225, 325, 425 cumulatively over a number of cycles of execution within a range. Logic induced errors can be identified for the logic under test 122 where there are no memory errors detected but a failure is detected by system checkers. A memory induced error may be identified in the memory under test 124 where there are no logic errors and a failure is detected by system checkers.

For example, a functional execution sequence 702 (with associated failing cycles indicated as black bars on cycle timeline 701) can involve actions performed by logic under test 122 of FIG. 1 and interactions with memory under test 124. Based on MISRs 205, 305, 405, a system fail 704 can be detected (e.g., based on comparisons of signatures 225, 325, 425) after executing a number of instructions between checkpoints. Signatures 225, 325, 425 can be cumulatively computed by MISRs 205, 305, 405 from the start of a search to a compare end-point. Since a large number of operations may occur between checkpoints, one or more binary searches can be used to progressively analyze and eliminate portions of the functional execution sequence 702 until a most likely failure source is identified. For example, the functional execution sequence 702 can include operations between checkpoint-a and checkpoint-z. Different types of signature registers can be analyzed between different checkpoints to search for specific types of failures. For instance, MISRs 205, 305, 405 can be associated with latches in the logic under test 122 of FIG. 1, memory inputs to the memory under test 124, or memory outputs of the memory under test 124. Upon a first fail cycle between a start and a binary search point range of checkpoints, latches and/or corresponding memory can be dumped for further diagnostic analysis. Although described as a binary search, other linear and/or hybrid search sequences can be used to optimize test time and the like.

In the example of FIG. 7, upon detection of system fail 704, a binary search for a memory input MISR fail can be initially performed over a memory search range 706 between checkpoint-a and checkpoint-z to confirm whether the system fail 704 is detectable. The functional execution sequence 702 can be run again between checkpoint-a and cycle z/2 (between checkpoint-e and checkpoint-f) to determine whether the system fail 704 initially occurs in the first half or the second half of the functional execution sequence 702. The binary search process can continue by checking for a memory input MISR fail between checkpoint-a and cycle z/4 (between checkpoint-c and checkpoint-d) and further between checkpoint-a and cycle z/8 (between checkpoint-b and checkpoint-c). If, for example, the system fail 704 is isolated as no fail up to checkpoint-c, then further searching can be performed from checkpoint-c up to the first memory fail cycle, indicating a failure of the memory under test 124.

If the system fail 704 is detected between checkpoint-a and checkpoint-c before accesses are made to the memory under test 124, a binary search over a logic range 708 can be performed using logic STUMP MISRs, such as MISRs 205, 305, 405. The binary search of logic range 708 can be performed by iteratively invoking a portion of the functional execution sequence 702 between checkpoint-a and cycle c/2 (between checkpoint-a and checkpoint-b). If the system fail 704 is not located between checkpoint-a and cycle c/2, further searching can be performed between checkpoint-a and cycle 3c/4. The searching can continue to progressively narrow the failure source down to a single cycle of the functional execution sequence 702 and thereby isolate a most likely failure source. In embodiments that use recirculating feedback rings, the failure search may be accelerated by restarting the functional execution sequence 702 at a previously executed intermediate value without returning back to the starting cycle of checkpoint-a (e.g., restart at checkpoint-b, checkpoint-d, checkpoint-f, checkpoint-g, etc.).

Figure 8:
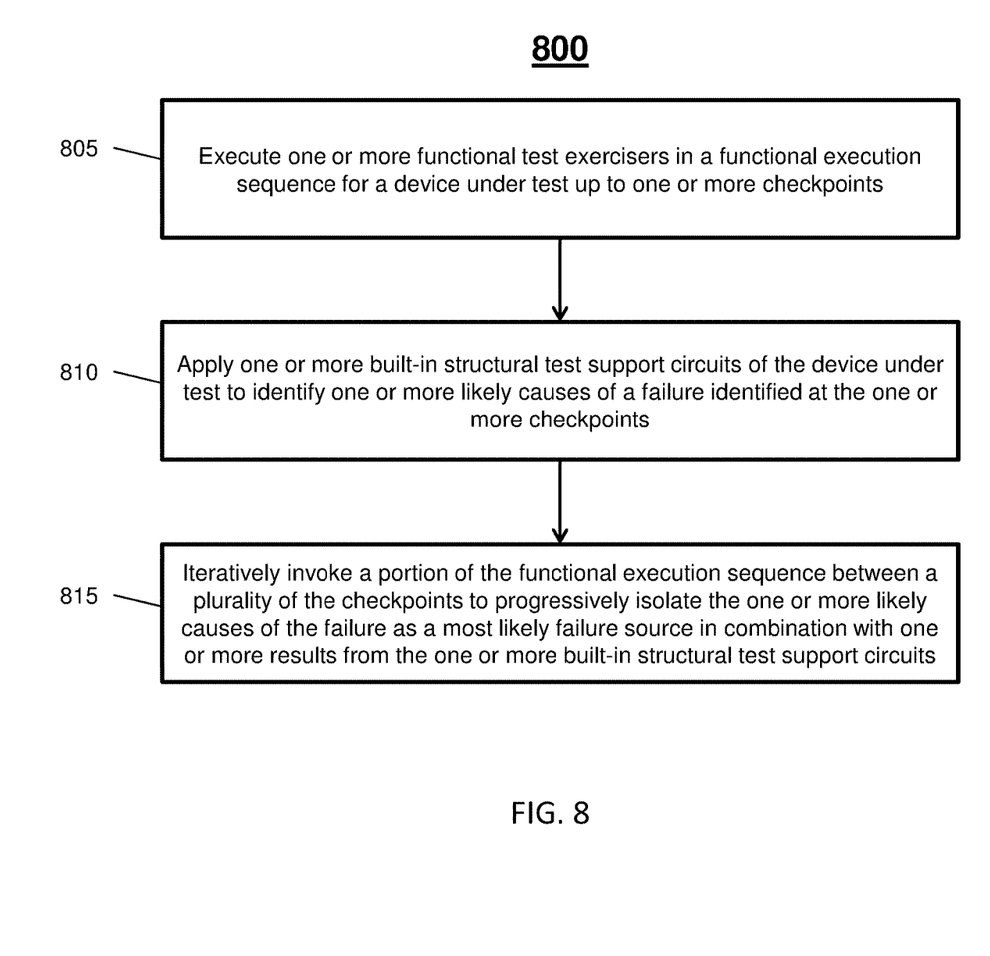
FIG. 8 illustrates a process flow for structurally assisted functional test and diagnostics in accordance with an embodiment.

Turning now to FIG. 8, a flow diagram of a process 800 for structurally assisted functional test and diagnostics for integrated circuits is generally shown in accordance with an embodiment. The process 800 is described with reference to FIGS. 1-7 and may include additional steps beyond those depicted in FIG. 8.

At block 805, one or more functional test exercisers 230, 330 (or individual ring scan clock control 417) execute in a functional execution sequence for DUT 112 up to one or more checkpoints, such as functional execution sequence 702 between checkpoint-a and checkpoint-z, where the functional execution sequence can be selected from functional execution sequences 114 to target particular portions of the logic under test 122 and/or memory under test 124. The logic under test 122 and/or memory under test 124 can each have at least one associated instance of one or more signature registers (e.g., MISRs 205, 305, 405).

At block 810, one or more built-in structural test support circuits 202, 302, 402 of the DUT 112 are applied to identify one or more likely causes of a failure identified at the one or more checkpoints, such as chain select 204, 304, 404; MISRs 205, 305, 405; and/or chains 211-214, 311-314, 411-415 for system fail 704.

At block 815, portions of the functional execution sequence 702 are iteratively invoked between a plurality of the checkpoints to progressively isolate the one or more likely causes of the failure as a most likely failure source in combination with one or more results from the one or more built-in structural test support circuits 202, 302, 402, for instance, as described in the example of FIG. 7. A plurality of cumulative results (e.g., signatures 225, 325, 425) from the one or more built-in structural test support circuits 202, 302, 402, can be stored in one or more signature registers (e.g., MISRs 205, 305, 405) from a starting configuration of the one or more functional test exercisers 230, 330 (or individual ring scan clock control 417) to a compare end-point at one of the one or more checkpoints, where the cumulative results are indicative of a pass signature or a fail signature.

A binary search can be applied between the one or more checkpoints based on analyzing the at least one associated instance of the one or more signature registers for the logic under test 122 and the memory under test 124 to isolate the most likely failure source as a portion of the logic under test 122 or a portion of the memory under test 124. The one or more built-in structural test support circuits 202, 302, 402 can include one or more self-test chains 222, 322, 422 operable to sequentially pass a plurality of test patterns through the logic under test 122 to the at least one associated instance of the one or more signature registers (e.g., MISRs 205, 305, 405) for the logic under test 122. One or more functional rings can be formed based on recirculating at least one of the one or more self-test chains 222, 322, 422. One or more intermediate signatures can be generated in the one or more signature registers (e.g., MISRs 205, 305, 405) based on capturing at least one output of the one or more functional rings to support intermediate stopping and starting of the functional execution sequence 702 at the one or more checkpoints.

Figure 9:
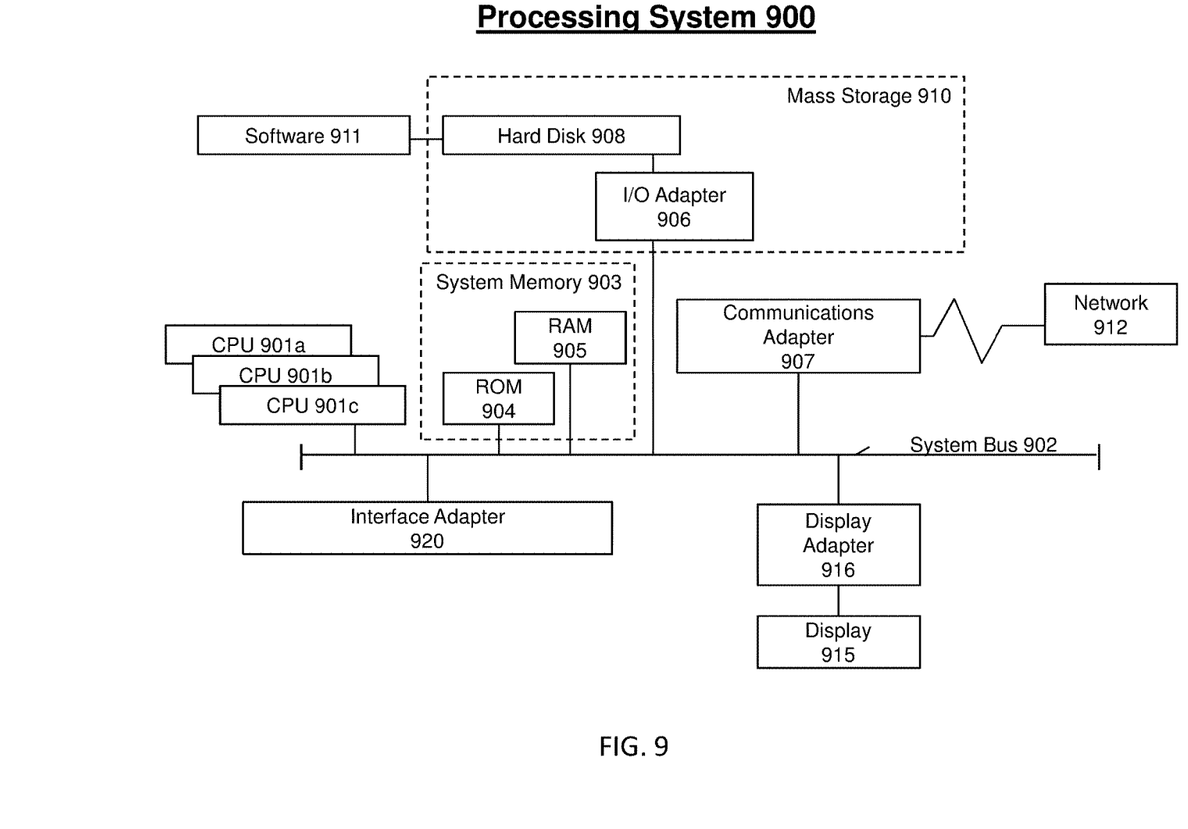
FIG. 9 illustrates a processing system in accordance with an embodiment.

Referring now to FIG. 9, there is shown an embodiment of a processing system 900 for implementing the teachings herein. In this embodiment, the processing system 900 has one or more central processing units (processors) 901a, 901b, 901c, etc. (collectively or generically referred to as processor(s) 901) that can be an embodiment of the processor 104 of FIG. 1. The processors 901, also referred to as processing circuits, are coupled via a system bus 902 to a system memory 903 and various other components (such as one or more DUT 112 of FIG. 1). The system memory 903 can include read only memory (ROM) 904 and random access memory (RAM) 905. The ROM 904 is coupled to system bus 902 and may include a basic input/output system (BIOS), which controls certain basic functions of the processing system 900. RAM 905 is read-write memory coupled to system bus 902 for use by the processors 901.

FIG. 9 further depicts an input/output (I/O) adapter 906 and a communications adapter 907 coupled to the system bus 902. I/O adapter 906 may be a small computer system interface (SCSI) adapter that communicates with a hard disk 908 and/or any other similar component. I/O adapter 906 and hard disk 908 are collectively referred to herein as mass storage 910. Software 911 for execution on the processing system 900 may be stored in mass storage 910. The mass storage 910 is an example of a tangible storage medium readable by the processors 901, where the software 911 is stored as instructions for execution by the processors 901 to perform a method, such as the process flows 500, 600, 800 of FIGS. 5, 6, and 8. Communications adapter 907 interconnects the system bus 902 with an outside network 912 enabling processing system 900 to communicate with other such systems. A display 915 is connected to system bus 902 via a display adapter 916, which may include a graphics controller to improve the performance of graphics intensive applications and a video controller. In one embodiment, adapters 906, 907, and 916 may be connected to one or more I/O buses that are connected to the system bus 902 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices can be connected to the system bus 902 via an interface adapter 920 and the display adapter 916. A keyboard, mouse, speaker can be interconnected to the system bus 902 via the interface adapter 920, which may include, for example, a Super I/O chip integrating multiple device adapters into a single integrated circuit.

Thus, as configured in FIG. 9, the processing system 900 includes processing capability in the form of processors 901, and, storage capability including the system memory 903 and the mass storage 910, input means such as keyboard and mouse, and output capability including speaker and the display 915. In one embodiment, a portion of the system memory 903 and the mass storage 910 collectively store an operating system, such as the z/OS or AIX operating system from IBM Corporation, to coordinate the functions of the various components shown in FIG. 9.

Technical effects and benefits include increased efficiency testing and fault cause isolation for a device under test. Embodiments support detection of intermittent fails while using at-speed functional test and diagnostics. Embodiment use built-in test support features for diagnostics at production and/or after deployment in the field.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of structurally assisted functional test and diagnostics, the method comprising:
   executing one or more functional test exercisers in a functional execution sequence for a device under test up to one or more checkpoints;
   applying one or more built-in structural test support circuits of the device under test to identify one or more likely causes of a failure identified at the one or more checkpoints;
   iteratively invoking a portion of the functional execution sequence between a plurality of the checkpoints to progressively isolate the one or more likely causes of the failure as a most likely failure source in combination with one or more results from the one or more built-in structural test support circuits; and
   storing a plurality of cumulative results from the one or more built-in structural test support circuits in one or more signature registers from a starting configuration of the one or more functional test exercisers to a compare end-point at one of the one or more checkpoints, wherein the cumulative results are indicative of a pass signature or a fail signature and wherein the device under test comprises logic under test and memory under test, the logic under test and the memory under test each having at least one associated instance of the one or more signature registers to isolate the most likely failure source as a portion of the logic under test or a portion of the memory under test.

2. The method of claim 1, further comprising applying a binary search between the one or more checkpoints based on analyzing the at least one associated instance of the one or more signature registers for the logic under test and the memory under test to isolate the most likely failure source as the portion of the logic under test or the portion of the memory under test.

3. The method of claim 1, wherein the one or more built-in structural test support circuits comprise one or more self-test chains operable to sequentially pass a plurality of test patterns through the logic under test to the at least one associated instance of the one or more signature registers for the logic under test.

4. The method of claim 3, further comprising forming one or more functional rings based on recirculating at least one of the one or more self-test chains.

5. The method of claim 4, further comprising generating one or more intermediate signatures in the one or more signature registers based on capturing at least one output of the one or more functional rings to support intermediate stopping and starting of the functional execution sequence at the one or more checkpoints.

6. A system comprising: a device under test comprising: one or more functional test exercisers; one or more built-in structural test support circuits; one or more signature registers, wherein a plurality of cumulative results from the one or more built-in structural test support circuits is stored in one or more signature registers from a starting configuration of the one or more functional test exercisers to a compare end-point at one of one or more checkpoints, wherein the cumulative results are indicative of a pass signature or a fail signature; logic under test; and memory under test, wherein the logic under test and the memory under test each have at least one associated instance of the one or more signature registers to isolate a most likely failure source as a portion of the logic under test or a portion of the memory under test; and a test and diagnostic system comprising a processor operable to initiate execution of a functional execution sequence in the one or more functional test exercisers up to the one or more checkpoints and configure the device under test to apply the one or more built-in structural test support circuits to identify one or more likely causes of a failure identified at the one or more checkpoints, and iteratively invoke a portion of the functional execution sequence between a plurality of the checkpoints to progressively isolate the one or more likely causes of the failure as the most likely failure source in combination with one or more results from the one or more built-in structural test support circuits.

7. The system of claim 6, wherein the test and diagnostic system is operable to apply a binary search between the one or more checkpoints based on analyzing the at least one associated instance of the one or more signature registers for the logic under test and the memory under test to isolate the most likely failure source as the portion of the logic under test or the portion of the memory under test.

8. The system of claim 6, wherein the one or more built-in structural test support circuits comprise one or more self-test chains operable to sequentially pass a plurality of test patterns through the logic under test to the at least one associated instance of the one or more signature registers for the logic under test.

9. The system of claim 8, wherein the device under test further comprises one or more functional rings operable to recirculate at least one of the one or more self-test chains.

10. The system of claim 9, wherein the device under test is operable to generate one or more intermediate signatures in the one or more signature registers based on capturing at least one output of the one or more functional rings to support intermediate stopping and starting of the functional execution sequence at the one or more checkpoints.

11. A computer program product comprising a computer readable storage medium having program instructions embodied therewith, wherein the computer readable storage medium is not a transitory signal per se, the program instructions executable by a processor to cause the processor to perform a method comprising:
    executing one or more functional test exercisers in a functional execution sequence for a device under test up to one or more checkpoints;
    applying one or more built-in structural test support circuits of the device under test to identify one or more likely causes of a failure identified at the one or more checkpoints;
    iteratively invoking a portion of the functional execution sequence between a plurality of the checkpoints to progressively isolate the one or more likely causes of the failure as a most likely failure source in combination with one or more results from the one or more built-in structural test support circuits; and
    storing a plurality of cumulative results from the one or more built-in structural test support circuits in one or more signature registers from a starting configuration of the one or more functional test exercisers to a compare end-point at one of the one or more checkpoints, wherein the cumulative results are indicative of a pass signature or a fail signature and wherein the device under test comprises logic under test and memory under test, the logic under test and the memory under test each having at least one associated instance of the one or more signature registers to isolate the most likely failure source as a portion of the logic under test or a portion of the memory under test.

12. The computer program product of claim 11, wherein the program instructions further cause the processor to perform:
    applying a binary search between the one or more checkpoints based on analyzing the at least one associated instance of the one or more signature registers for the logic under test and the memory under test to isolate the most likely failure source as a portion of the logic under test or a portion of the memory under test.

13. The computer program product of claim 11, wherein the one or more built-in structural test support circuits comprise one or more self-test chains operable to sequentially pass a plurality of test patterns through the logic under test to the at least one associated instance of the one or more signature registers for the logic under test.

14. The computer program product of claim 13, wherein the program instructions further cause the processor to perform:
    forming one or more functional rings based on recirculating at least one of the one or more self-test chains; and
    generating one or more intermediate signatures in the one or more signature registers based on capturing at least one output of the one or more functional rings to support intermediate stopping and starting of the functional execution sequence at the one or more checkpoints.

\* \* \* \* \*